US012694912B2

(12) United States Patent
Rana et al.

(10) Patent No.: US 12,694,912 B2
(45) Date of Patent: Jul. 28, 2026

(54) MEMORY CIRCUIT ARRANGEMENT FOR ACCURATE AND SECURE READ

(71) Applicant: STMicroelectronics International N.V., Geneva (CH)

(72) Inventors: Vikas Rana, Noida (IN); Arpit Vijayvergia, Bhopal (IN)

(73) Assignee: STMicroelectronics International N.V., Geneva (CH)

( * ) Notice: Subject to any disclaimer, the term of this patent is extended or adjusted under 35 U.S.C. 154(b) by 21 days.

(21) Appl. No.: 18/676,354

(22) Filed: May 28, 2024

(65) Prior Publication Data

US 2024/0312495 A1     Sep. 19, 2024

Related U.S. Application Data

(60) Division of application No. 18/063,041, filed on Dec. 7, 2022, now Pat. No. 12,033,715, which is a continuation of application No. 17/321,344, filed on May 14, 2021, now Pat. No. 11,551,731.

(60) Provisional application No. 63/031,420, filed on May 28, 2020.

(51) Int. Cl.
*G11C 29/04*     (2006.01)
*G11C 7/06*      (2006.01)
*H03K 19/20*     (2006.01)

(52) U.S. Cl.
CPC ................ *G11C 7/06* (2013.01); *H03K 19/20* (2013.01)

(58) Field of Classification Search
CPC .................................................. G11C 29/04
See application file for complete search history.

(56) References Cited

U.S. PATENT DOCUMENTS

| | | | |
|---|---|---|---|
| 5,384,784 | A | 1/1995 | Mori et al. |
| 7,574,576 | B2 | 8/2009 | Kato et al. |
| 8,464,020 | B2 | 6/2013 | Toyama et al. |
| 8,527,691 | B2 | 9/2013 | Honda et al. |
| 9,947,398 | B1 | 4/2018 | Lin et al. |
| 10,224,088 | B1 | 3/2019 | Choy et al. |
| 2007/0167846 | A1* | 7/2007 | Sternickel .............. G06N 3/086 |
| | | | 600/509 |
| 2008/0219070 | A1 | 9/2008 | Akiyama |
| 2010/0296355 | A1 | 11/2010 | Mochida |
| 2013/0155780 | A1 | 6/2013 | Park |
| 2013/0336052 | A1 | 12/2013 | Jurasek et al. |
| 2014/0185361 | A1 | 7/2014 | Oh et al. |
| 2014/0192581 | A1 | 7/2014 | Achter et al. |
| 2015/0270006 | A1 | 9/2015 | Yoo et al. |

(Continued)

FOREIGN PATENT DOCUMENTS

| | | |
|---|---|---|
| CN | 101770806 A | 7/2010 |
| CN | 106887246 A | 6/2017 |
| DE | 10135573 A1 | 10/2002 |

*Primary Examiner* — Hoai V Ho
(74) *Attorney, Agent, or Firm* — Seed Intellectual Property Law Group LLP

(57)     ABSTRACT

The present disclosure is directed to arranging user data memory cells and test memory cells in a configurable memory array that can perform both differential and single ended read operations during memory start-up and normal memory use, respectively. Different arrangements of the user data memory cells and the test memory cells in the memory array result in increased effectiveness of memory array, in terms of area optimization, memory read accuracy and encryption for data security.

18 Claims, 9 Drawing Sheets

(56) References Cited

U.S. PATENT DOCUMENTS

| | | |
|---|---|---|
| 2015/0378801 A1 | 12/2015 | Navon et al. |
| 2018/0366170 A1 | 12/2018 | Luo et al. |
| 2023/0107851 A1 | 4/2023 | Rana et al. |

* cited by examiner

| EN | A<0> | A<1> | $Y_M$ <0> | $Y_M$ <1> | $Y_M$ <2> | $Y_M$ <3> |
|----|------|------|-----------|-----------|-----------|-----------|
| 0  | 0    | 0    | 1         | 0         | 0         | 0         |
| 0  | 0    | 1    | 0         | 0         | 1         | 0         |
| 0  | 1    | 0    | 0         | 1         | 0         | 0         |
| 0  | 1    | 1    | 0         | 0         | 0         | 1         |
| 1  | 0    | 0    | 1         | 0         | 1         | 0         |
| 1  | 0    | 1    | 0         | 0         | 0         | 0         |
| 1  | 1    | 0    | 0         | 1         | 0         | 1         |
| 1  | 1    | 1    | 0         | 0         | 0         | 0         |

FIG. 4B

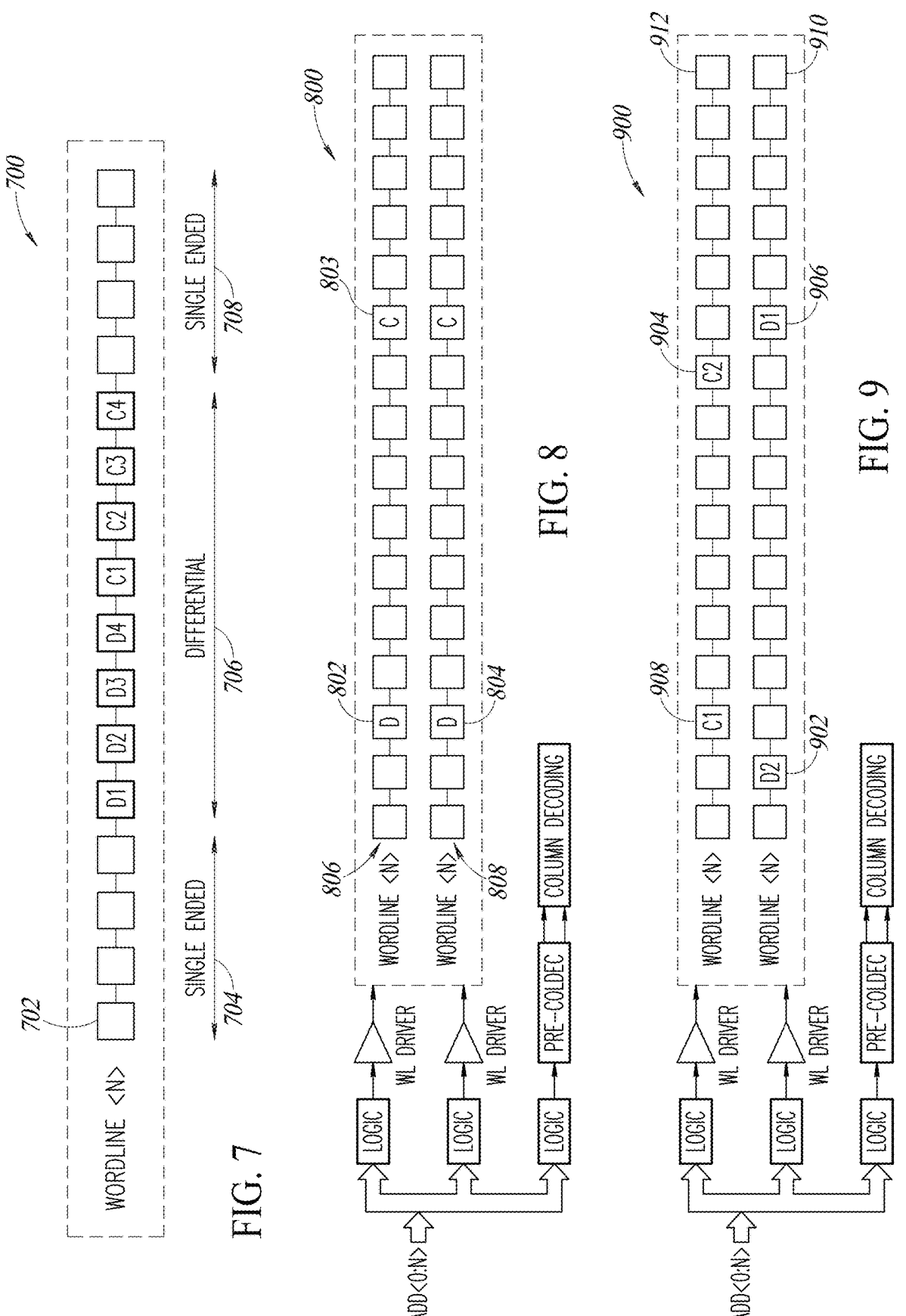

MEMORY CIRCUIT ARRANGEMENT FOR ACCURATE AND SECURE READ

BACKGROUND

Technical Field

During a boot operation of non-volatile memory (NVM), trimming and configuration bits are supplied to components of a system on chip (SOC), including a reference current block, which provides stable current to the components of the SOC.

Description of the Related Art

NVM can be read with a differential read or a single ended read. To perform the differential read, where every bit is stored in two physical cells called as a direct cell and a complementary cell. A same bit is stored in the direct cell as logic one and the complementary cell as logic zero or vice versa.

When a read operation is performed on a cell, currents from the direct cell and its complementary cell are compared using a sense amplifier. Output of the sense amplifier is either high or low. In some circumstances, a high sense amplifier output would indicate that an erased cell has been read and a low sense amplifier output would indicate that a programmed cell has been read. In other circumstances, a high sense amplifier output would indicate that a programmed cell has been read and a low sense amplifier output would indicate that an erased cell has been read.

The differential read eliminates the dependency on availability of a reference current from a bandgap or current reference block, at the time of boot operation. There are NVM arrays that include cells for differential read and cells for single ended reads.

BRIEF SUMMARY

A primary memory array includes a plurality of configurable rows each having a plurality of memory cells. The memory cells are of two types, including user memory cells and test memory cells. The user memory cells include the information or data to be stored in the memory. The test memory cells are configuration or trimming bits to be used in a start-up or in a boot operation. The test memory cells are of two types, including test data memory cells and complementary test data memory cells.

The configurable rows of the present disclosure can be configured as user memory cells or test memory cells. Every memory cell can be configured as either a test memory cell or a user memory cell. For example, a single row may include user memory cells and test memory cells. In a first configuration, a first cell of a row may be used as a user memory cell. In a second configuration, the first cell of the row may be used as a test memory cell.

The primary memory array includes a plurality of columns made of the memory cells. The primary memory array includes a plurality of word lines such that every configurable row is coupled to a word line. The primary memory array also has a plurality of bit lines such that a bit line is coupled to every column. A column multiplexor is coupled to the plurality of bit lines. The column multiplexor includes a first plurality of transistors where each transistor is coupled to one of the plurality of bit lines. There are at least two rows of the first plurality of transistors. Each row of the first plurality of transistors includes two groups of transistors in some embodiments.

The column multiplexor also has a plurality of group selection transistors where each group selection transistor is coupled to one of the two groups of transistors of the first plurality of transistors. The column multiplexor also has two types of mode selection transistors. One type of mode selection transistors (a first mode selection transistor) is coupled to an inverter and the other type, includes a plurality of second mode selection transistors. Each of the second mode selection transistors is coupled to one of the groups of the group selection transistors. A sense amplifier is coupled to the column multiplexor which includes an op-amp and two current to voltage convertors coupled to the op-amp. The mode selection transistors are coupled to the current to voltage convertors. A reference current transistor switch is coupled to the first mode selection transistors through the inverter. A source of the reference current transistor switch is coupled to a reference memory-cell array, which can be used to provide a reference current to the primary memory array for single ended read operations.

During a boot operation, a NVM read operation is not reliable in the absence of a stable reference current form a bandgap or current reference block. At the same time, the bandgap or current reference block cannot provide a stable current to the NVM primary array as reliable trimming and configuration bits are not available from the NVM. As such, these trimming and configuration bits are stored in the test memory cells, to be read in a differential manner during the boot operation.

In one embodiment, a reference current can also be generated using a reference memory cell array in place of a bandgap or reference current generator. The reference memory cell array includes one or more memory cells, which are formed in the same process as the memory cells of the primary memory array. Accordingly, a response to process and temperature variations of the reference memory cell array is similar to the primary memory cell array, which leads to better accuracy of single ended read operations. The accuracy of the reference current obtained from the reference memory cell array is adjustable by selecting a number of the memory cells to generate the reference current. This reference current is generated based on an average of all selected memory cells in the reference current array. By selecting a larger number of the memory cells to generate the reference current, the accuracy of the reference current, which is an average of all the selected cells, increases.

The primary memory array can have a number of memory cells arranged in two or more rows of words such that cells in every row are test memory cells and user memory cells. The test memory cells are of two types: data memory cells and their complements, called complementary data memory cells. The data in the data memory cells is also stored in their complementary data memory cells for a differential read operation. In the present disclosure, each row can contain both data memory cells, associated complementary data memory cells, and user memory cells, such that the row can have a single ended read portion and a differential read portion. In one arrangement, a first group of the user memory cells are spaced from a second group of the user memory cells of a single row by the data and complimentary data memory cells of the same row. Alternatively, each row can also be configured such that the data memory cells and the complementary data memory cells are separated from each other by the user memory cells. In this embodiment, each row can be configured in a variety of orientations of user data memory cells, data memory cells, and complimentary data cells to provide flexibility of use. This can be adjusted as a user is storing data based on the parameters of use of the memory array. This allows for optimal use of an area of the main memory array.

In another embodiment, the primary memory array can have memory cells arranged in two or more consecutive rows of words where placement of the memory cells in one row is identical to placement of the memory cells in the other row. During use, instead of obtaining current from a single memory cell to be read, an average current is acquired by selecting the identical cells from the two or more consecutive rows. The average current of the two or more identical memory cells allows for a more accurate read of the memory cell as compared to reading a single cell.

In another embodiment, where a differential read is implemented, more than one row of memory cells of the memory array can be configured, such that the data memory cells are in one row and the associated complementary data memory cells are in the another row. The rows may be physically adjacent to each other or these rows may be separated by other rows of the memory array. Such an arrangement allows the read operation to be more secure by providing immunity from data hacking.

BRIEF DESCRIPTION OF THE SEVERAL VIEWS OF THE DRAWINGS

FIG. 4B is a truth table of the column decoder of FIG. 4A;

FIG. 7 is a word line that includes a plurality of memory cells having both singled ended and differential read cells;

FIG. 8 is a plurality of consecutive word lines, each having a plurality of memory cells and circuit components to generate more reliable read information;

FIG. 9 is a plurality of consecutive word lines, each having a plurality of memory cells and circuit components for data encryption and data security related applications in an alternative embodiment of the present disclosure.

DETAILED DESCRIPTION

Figure 1:
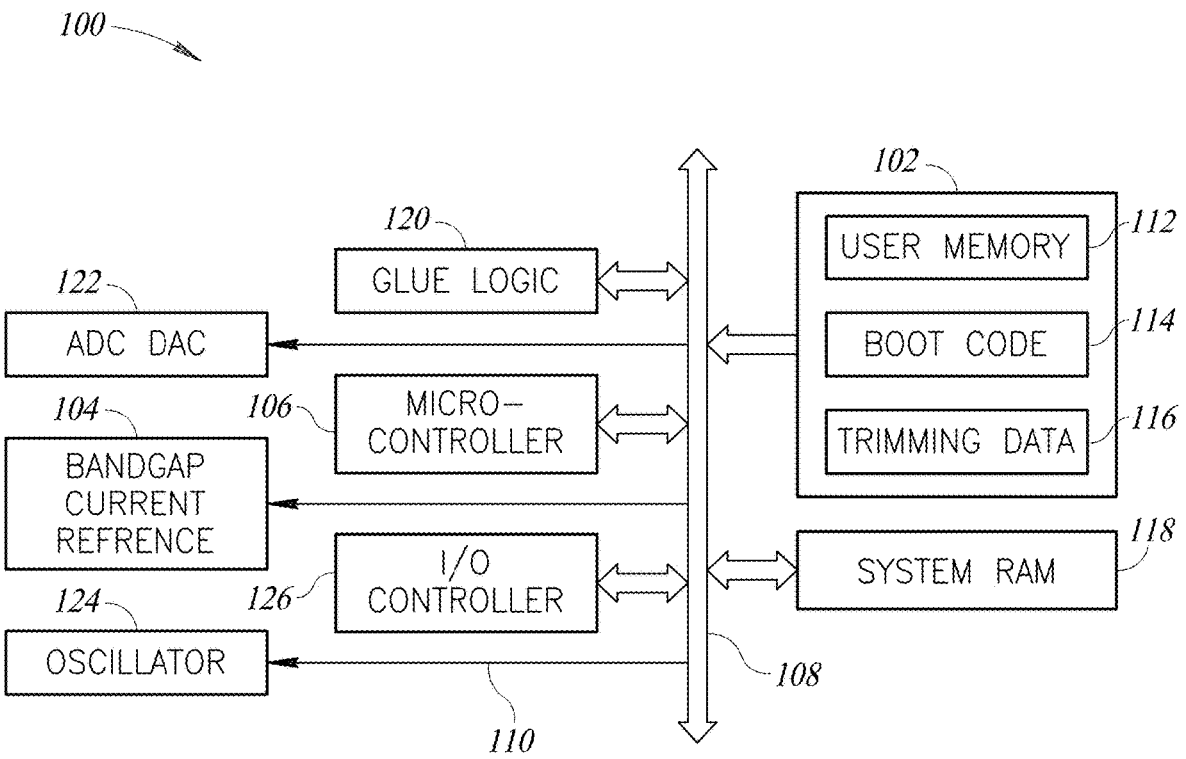
FIG. 1 is a block diagram of components of a system on chip.

FIG. 1 is a block diagram of components of a system on chip (SOC) 100 that includes a non-volatile memory (NVM) array 102 coupled to a data bus 108. The NVM array 102 includes a user memory section 112, a boot code section 114, and a trimming data section 116. The user memory section 112 stores data associated with the use of the memory by a user. The boot code section 114 includes data associated with the start-up of the memory array. The trimming data section 116 includes calibration information that may be used with the boot code section 114 data during the start-up of the memory array.

The NVM array 102 is coupled to a system random access memory (RAM) 118 through the bus 108. The system RAM 118 is used in conjunction with the NVM array 102 during operation of the SOC 100. The user memory 112 is a non-volatile memory from which data is copied on to the system RAM 118, which is a volatile memory, at a time of the SOC 100 start-up. The data is copied into the system RAM 118 from the user memory 112 to enable high frequency communication with a microcontroller 106. The data from the system RAM 118 is erased when the SOC 100 is shut down. In contrast, the data in the user memory 112 is retained even after the SOC 100 shuts down.

An input/output (I/O) controller 126 is coupled to the bus 108 for controlling and monitoring data entering and leaving the SOC 100. The microcontroller 106 is also on the SOC 100 and coupled to the bus 108. Additional digital logic may be included in the SOC 100, as glue logic 120. A digital to analog convertor and an analog to digital convertor (ADC DAC) block 122 of the SOC 100 receives trimming bits from the trimming data block 116 of the NVM array 102 for calibration. An oscillator block 124, coupled to the NVM array 102 with electrical connection 110, is used to generate a clock, which receives configuration bits from the boot code block 114 of the NVM array 102. A bandgap current reference block 104 is coupled to the NVM array 102, which provides the reference current to the user memory 112 of the NVM array 102 after the SOC 100 start-up.

During the SOC 100 boot or start-up operation, the NVM array 102 read operation is not reliable in the absence of a stable reference current from the bandgap current reference block 104. At the same time, the bandgap current reference block 104 cannot provide the stable reference current to the NVM array 102, as the reliable trimming and configuration bits are not available from the NVM array 102. As such, these trimming and configuration bits are stored in the test or start-up parameter memory cells, to be read in a differential manner during the boot operation.

Figure 2:
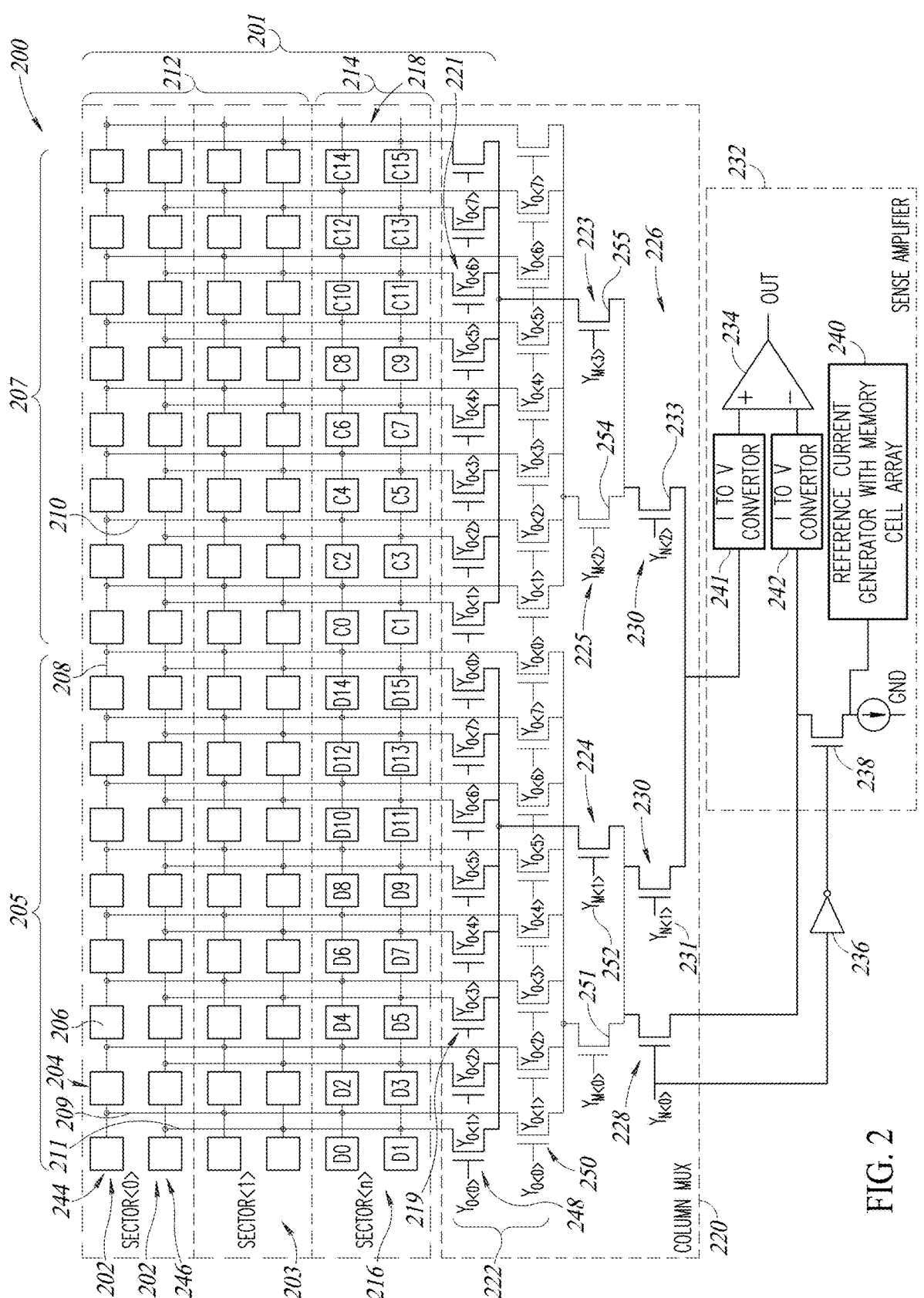
FIG. 2 is an array of memory cells and circuit components for differential and single ended read.

FIG. 2 is an array 200 of memory cells and circuit components for differential and single ended read. The memory array 200 includes a primary memory cell array 201 coupled to a bit line or column multiplexor 220, which is coupled to a sense amplifier 232. The primary memory cell array 201 includes a plurality of memory sectors 203, each including a plurality of memory cell rows 202. Each row of the plurality of memory cell rows 202 includes a plurality of memory cells 206. In this embodiment, each memory sector of the plurality of memory sectors 203 has two memory cell rows, a first memory cell row 244 and a second memory cell row 246. In other embodiments, each memory sector 203 may have more than two memory cell rows.

Each memory cell row of the plurality of memory cell rows 202 includes an even number of memory cells of the plurality of memory cells 206. The even number of memory cells 206 are divided into two groups, a first group 205 and a second group 207. The first group 205 and the second group 207 are coupled to the column multiplexor 220, the operation of which is described in more detail below.

The plurality of memory cell rows 202 can be configured either as a plurality of user memory cell rows 212 (see SECTOR<0> and SECTOR<1>) or as a plurality of test memory cell rows 214, (see SECTOR<n>). The memory cells 206 of the user memory cell rows 212 can be configured as data storage elements, to store data for all activities other than the SOC boot operation. The memory cells 206 of the test memory cell rows 214 can be configured as the test memory cells, where data is stored for the purpose of the SOC boot operation, which is configured for a differential read that does not rely on the reference current. The test memory cells are of two types, data memory cells 216 (labeled D0 through D15) and complementary data memory cells 218 (labeled C0 through C15). The primary memory cell array 201 further includes a plurality of wordlines 208 such that each wordline of the plurality of wordlines 208 is coupled to each row of the plurality of memory cell rows 202. The primary memory cell array 201 also includes a plurality of bitlines 210. In the embodiment with two rows 202 per sector 203, a first bitline 209 is coupled to a first row 244 and a second bitline 211 is coupled to a second row 246 (see SECTOR <0>). The first bitline 209 is coupled to each first row 244 of each sector 203 and the second bitline 211 is coupled to each second row 246 of each sector 203.

A plurality of memory cell columns 204 are coupled to the column multiplexor 220. Each column will include one memory cell from each row of the sector. The bitlines are coupled to every other row of a column. The columns 204 will be discussed below with respect to operation of the memory array.

The column multiplexor 220 includes a first plurality of rows of bitline selection transistors 222, where each transistor of the first plurality of the bitline selection transistors 222 is coupled to a unique bitline of the plurality of the bitlines 210. Each row of the first plurality of bitline selection transistors 222 includes a first group 219 and a second group 221 of transistors. The first group of memory cells 205 of each row is coupled to the first group 219 of the first plurality of bitline selection transistors 222. The second group of memory cells 207 of each row is coupled to the second group 221 of the first plurality of bitline selection transistors 222. The plurality of rows of bitline selection transistors 222 are arranged as a first row of bitline selection transistors 248 and a second row of bitline selection transistors 250. The transistors of the first row of the bitline selection transistors 248 are coupled to the transistors of the second memory cell row 246 of the memory sectors 203 through the second bitlines 211. The transistors of the second row of the bitline selection transistors 250 are coupled to the transistors of the first memory cell row 244 of the memory sectors 203 through the first bitlines 209. The column multiplexor 220 further includes a plurality of group selection transistors, which comprise the first group 224 and the second group 225, where each transistor of the plurality of group selection transistors 224 is coupled to the group 219 of the plurality of the bitline selection transistors 222 and each transistor of the plurality of group selection transistors 225 is coupled to the group 221 of the plurality of the bitline selection transistors 222.

The primary memory cell array 201 may be read in either a differential read mode or a single ended read mode. The column multiplexor 220 includes a plurality of mode selection transistors 226 facilitating differential and single ended read mode. In differential read mode, two memory cells 206 are used to store a bit of data, one memory cell 206 in first group 205 and the other memory cell 206 in second group 207. In single ended read mode each one of memory cells 206 is used for one bit of data. Each transistor of the plurality of the mode selection transistors 226 is coupled to the one of the groups of the plurality of the group selection transistors 224 and 225. For example, a plurality of transistors Y0<0>-Y0<7> of the first group 219 of the first row of bitline selection transistors 248 is coupled to a transistor YM<1> of the first group of the group selection transistors 224. The transistor YM<1> is coupled to both YN<0> of the first type of mode selection transistor 228 and YN<1> of the second type of mode selection transistors 230. A plurality of transistors Y0<0>-Y0<7> of the first group 219 of the second row of bitline selection transistors 250 is coupled to a transistor YM<0> of the first group of the group selection transistors 224. The transistor YM<0> is coupled to both YN<0> of the first type of mode selection transistor 228 and YN<1> of the second type of mode selection transistor 230. A similar arrangement applies to the second group 221 as can be seen in FIG. 2.

The two types of mode selection transistors 226 include a first type of the mode selection transistor 228 (YN<0>) and a second type of mode selection transistors 230 (YN<1> and YN<2>), where each transistor of the mode selection transistors 226 has a gate terminal, a source terminal, and a drain terminal. The column multiplexor 220 is coupled to the sense amplifier 232 through the mode selection transistors 226. The sense amplifier includes a first current to voltage convertor 241 and a second current to voltage convertor 242 that are both coupled to an op-amp 234. A reference current transistor switch 238 is coupled to the second current to voltage convertor 242 and to a reference current generator with memory cell array 240. This may be considered a replica bias generator that tracks the current of memory cells over temperature, process, voltage, etc.

The gate terminal of the first type of the mode selection transistor 228 is coupled to a gate terminal of the reference current transistor switch 238 through an inverter 236. The source terminal of the first type of the mode selection transistor 228 is coupled to an input of the second current to voltage convertor 242. The source terminal of the second type of mode selection transistors 230 of the plurality of mode selection transistors 226 are coupled together and coupled to an input of the first current to voltage convertor 241. An output of the first current to voltage convertor 241 is coupled to an input of a positive terminal of the op-amp 234. An output of the second current to voltage convertor 242 is coupled to an input of a negative terminal of the op-amp 234.

Figure 3:
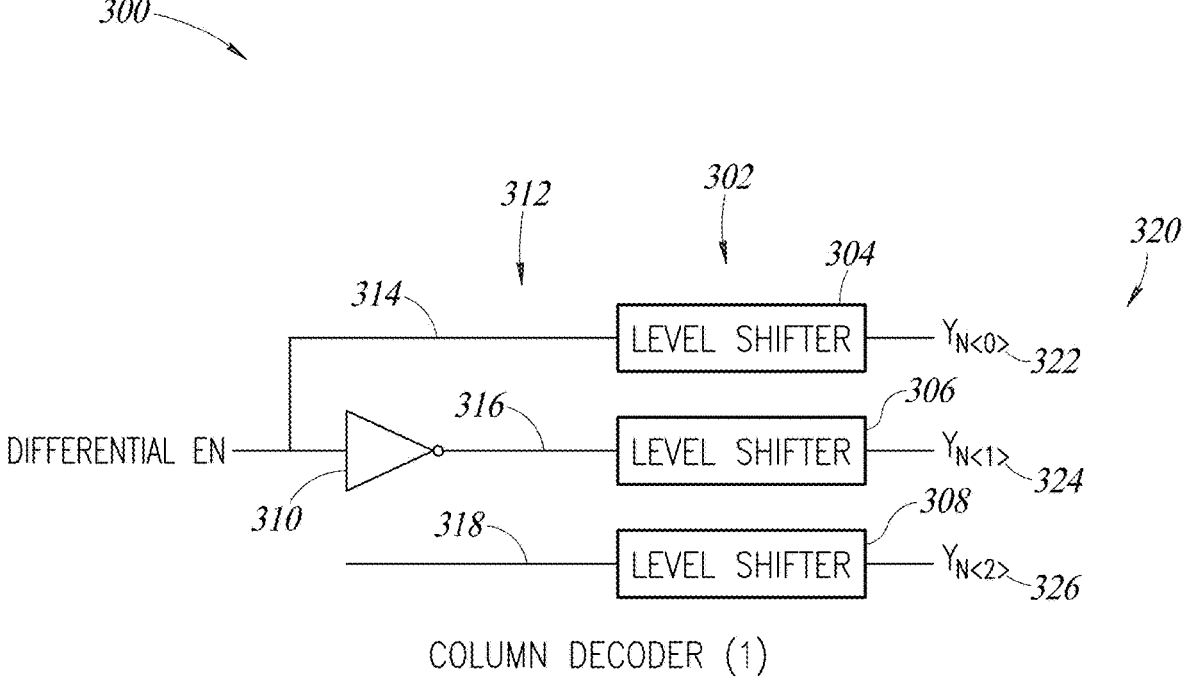
FIGS. 3 and 4A are a column decoder according to an embodiment of the present application.

FIG. 3 includes a column decoder 300 for selecting one or more of the mode selection transistors YN<0>, YN<1> and YN<2> from the plurality of the mode selection transistors 226. The column decoder 300 includes a plurality of level shifters 302, a plurality of inputs 312 coupled to the level shifters 302 and an inverter 310. A first level shifter 304 of the plurality of level shifters 302 and the inverter 310 receive a differential enable signal 314. A second level shifter 306 of the plurality of level shifters 302 receives an input signal 316, which is an output of the inverter 310. An output signal 316 of the inverter 310 is the inverted differential enable signal 314. A third input signal 318 is an input to a level shifter 308 of the plurality of level shifters 302.

The plurality of level shifters 302, increases or decreases voltage levels of the plurality of the inputs 312 to the plurality of level shifters 302. A plurality of output signals 320 are output from the plurality of level shifters 302. A first output signal 322 of the plurality of the output signals 320 is output from the level shifter 304, a second output signal 324 of the plurality of the output signals 320 is output from the level shifter 306, and a third output signal 326 of the plurality of the output signals 320 is output from the level shifter 308. The output signal 322 is coupled to the gate of the first type of the mode selection transistor 228. The output signals 324 and 326 are connected to the gates of the two mode selection transistors 231, 233 of the second type 230.

As explained above the memory array 200 in FIG. 2 can be read either in the differential read mode or in the single ended read mode. For differential read of the memory array, the differential enable signal 314 is kept high and for single ended read of the memory array, the differential enable signal 314 is kept low. When the differential enable signal 314 is high, then the mode selection transistor switch 231 is off and the mode selection transistor switches 228 and 233 are on. When the differential enable signal 314 is low then the mode selection transistor switch 228 is off and the mode selection transistor switches 231 and 233 are on.

FIG. 4 includes another column decoder 400 for selecting one or more of the group selection transistors YM<0> and YM<1> for example, from a plurality of the group selection transistors 223. The column decoder 400 includes a plurality of inverters 401 that are coupled to a plurality of address bits 404. There are a plurality of outputs 423 of plurality of inverters 401. There are a plurality of AND gates 407 that are coupled to a plurality of level shifters 412. There is an exclusive OR (X-OR) gate 417 that is coupled to ones of the plurality of AND gates 407. There are a plurality of level shifter outputs 418. The address bits 404 further include, a first address bit 405 coupled to a first inverter 402 and a second address bit 406 coupled to a second inverter 403. The plurality of AND gates 407 further include AND gates 408, 409, 410 and 411. The plurality of level shifters 412 further include level shifters 413, 414, 415 and 416. The level shifter output 419 is output from the level shifter 413, the level shifter output 420 is output from the level shifter 414, the level shifter output 421 is output from the level shifter 415 and the level shifter output 422 is output from the level shifter 416.

The outputs of the inverters 402 and 403 are coupled to the inputs of AND gate 408, the output of which is coupled to the input of the level shifter 413. The input to inverter 402, which is coupled to the address bit 405, and the output 425 of inverter 403 are coupled to the inputs of AND gate 409, the output of which is coupled to the input of the level shifter 414. An input 427 of the AND gate 410 is coupled to the output 424 of the inverter 402. Another input 428 of the AND gate 410 is coupled to an output 429 of the X-OR gate 417. An input 430 of the AND gate 411 is coupled to the input of the inverter 402, which is coupled to the address bit 405. Another input 431 of the AND gate 411 is coupled to the output 429 of the X-OR gate 417. An input 432 of the X-OR gate 417 is coupled to an input 435 of the inverter 403, which is coupled to the address bit 406. An input 426 to the X-OR gate 417 is coupled to the differential enable signal 314.

The level shifter output 419 is coupled to the gate of the transistor 251 of the first group 224 of the plurality of group selection transistors 223. The level shifter output 420 is coupled to the gate of the transistor 252 of the first group 224 of the plurality of group selection transistors 223. The level shifter output 421 is coupled to the gate of the transistor 254 of the second group 225 of the plurality of group selection transistors 223. The level shifter output 422 is coupled to the gate of the transistor 255 of the second group 225 of the group selection transistors 223.

As explained above the memory array 200 can be read either in the differential read mode or in the single ended read mode. For differential read of the memory array, the differential enable signal 314 is kept high and for single ended read of the memory array, the differential enable signal 314 is kept low as an example of one configuration.

Figure 4A:
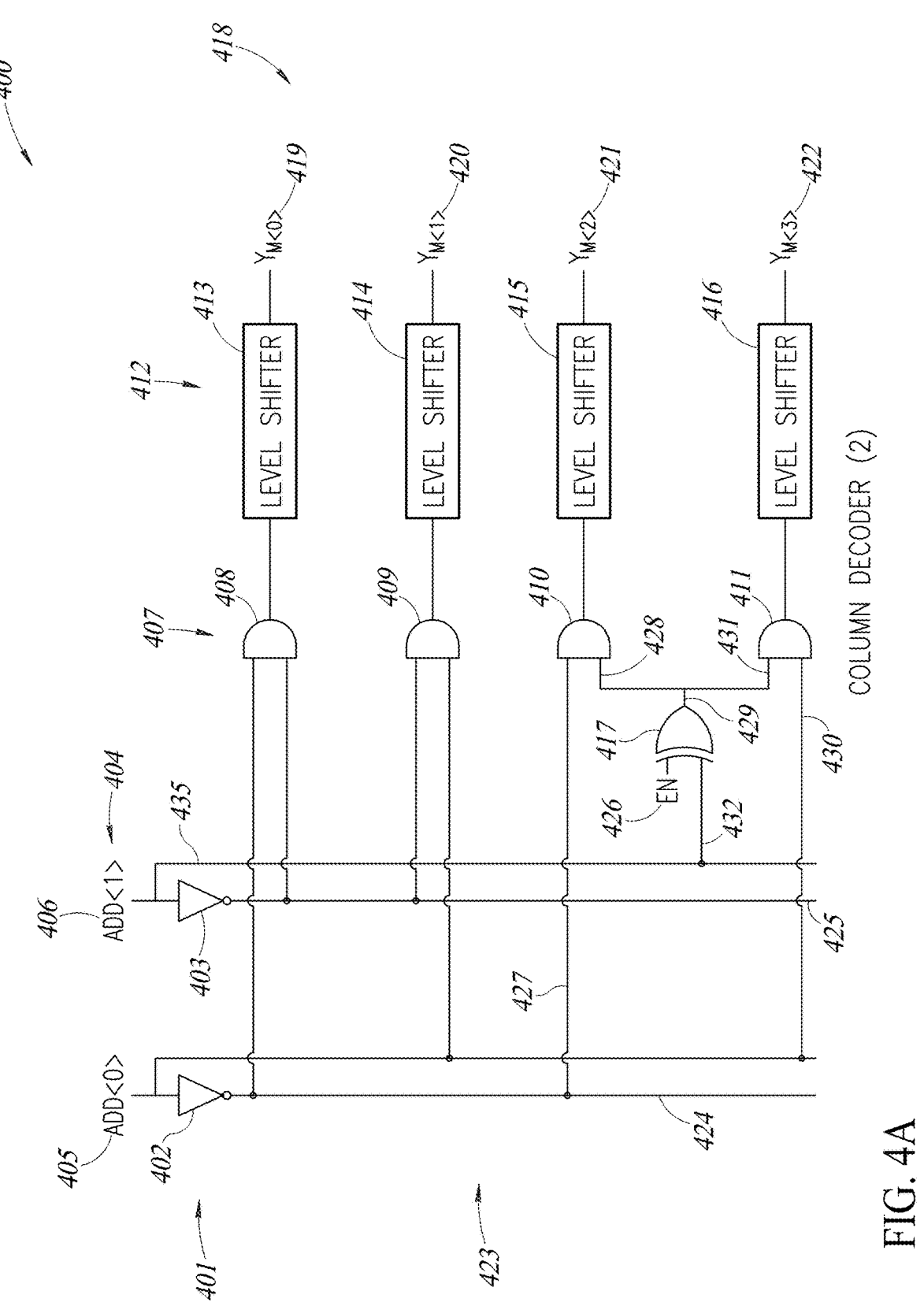

When the group selection transistors 251, 252, 254 and 255 are on, this is indicated by logic one. When the group selections transistors 251, 252, 254 and 255 are off, this is indicated by logic zero. A truth table of the circuit of FIG. 4A is in FIG. 4B, which captures the logic states of the group selection transistors 251, 252, 254 and 255. The truth table provides different logic states of the group selection transistors for different logic values of the enable signal 314 and the address bits 405 and 406.

Figure 5:
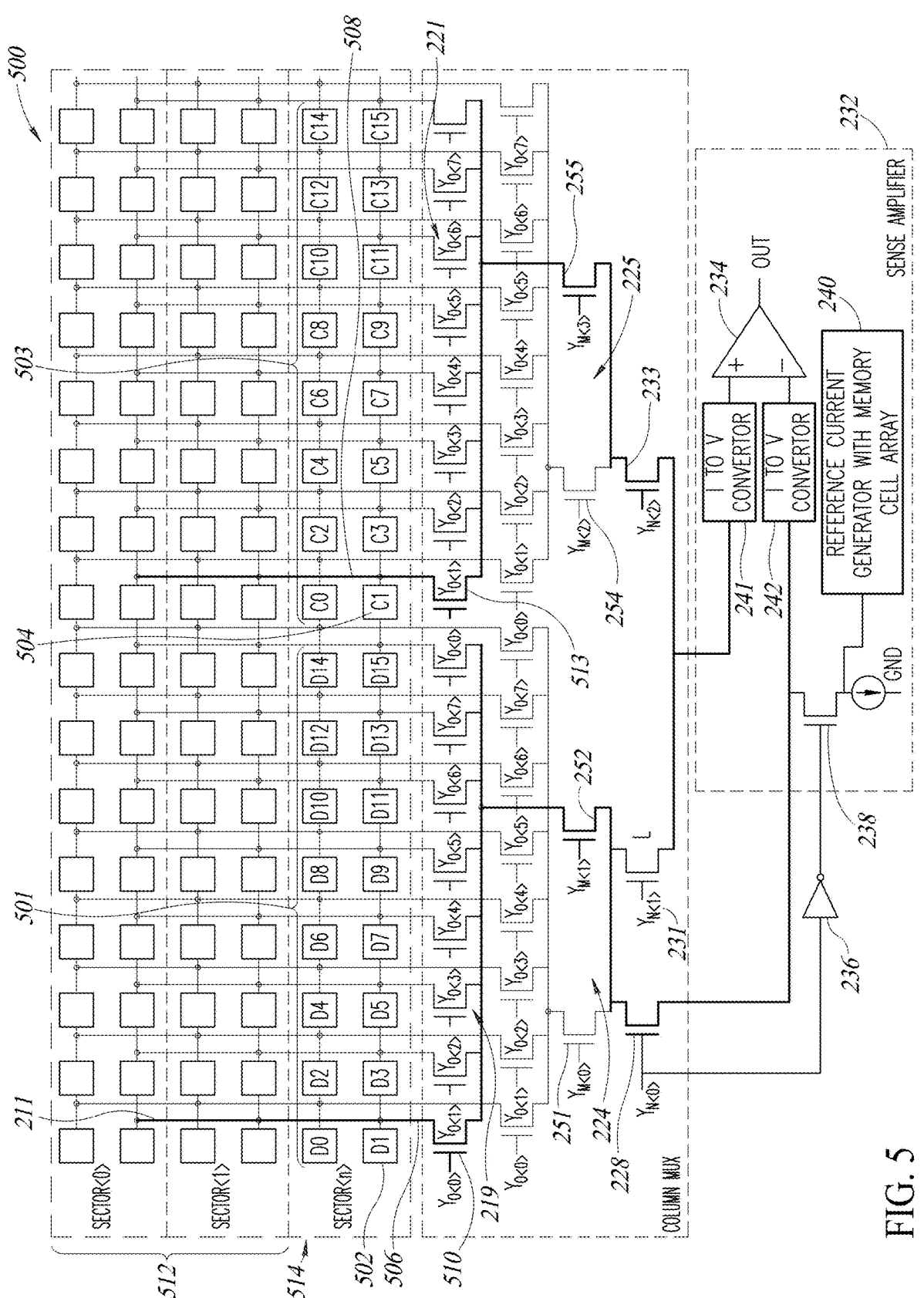
FIGS. 5 and 6 are the array of memory cells of FIG. 2 illustrating an example of differential read and singled ended read.
Figure 6:
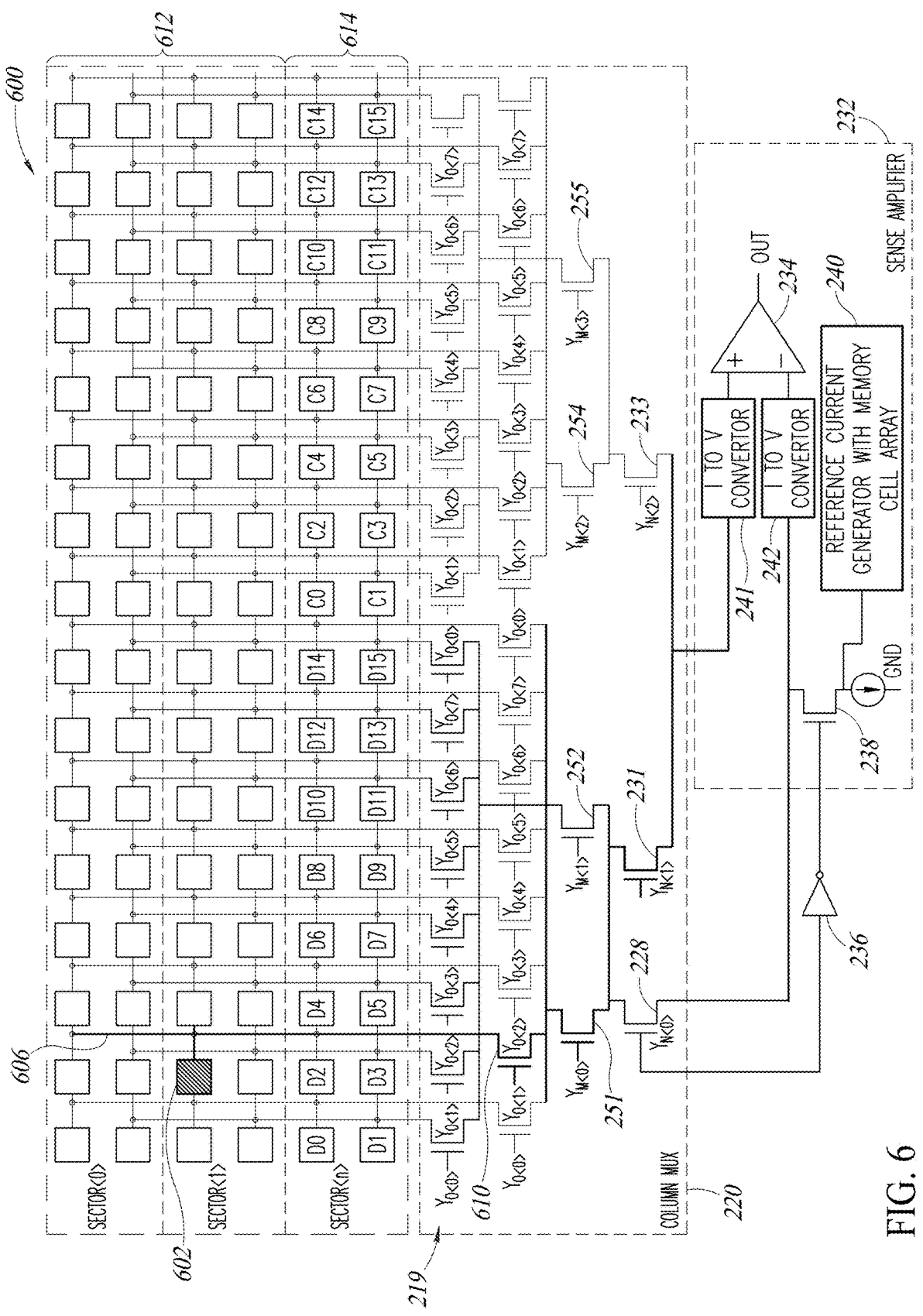

FIG. 5 includes an array 500 of memory cells and circuit components that are a representation of the memory array of FIG. 2, which can be operated in the single ended or the differential read operation. FIG. 5 illustrates the differential read operation of the memory array 500. The differential read operation is performed at the start-up or the boot operation such that the bandgap reference current is not yet stable and is not used. Differential read operation may be used in other operations of the memory as well. In FIG. 6, the reference current generator with memory cell array 240 is utilized during a singled ended read of data stored in the memory array.

The memory array 500 includes a plurality of user memory sectors 512 and one or more test memory sectors 514. The test memory sector 514 is configured for the differential read operation whereas the user memory sectors 512 are configured for the single ended read operation. The test memory sector 514 includes test data memory cells 501 and complementary test data memory cells 503. Every test data memory cell has a corresponding complementary test data memory cell in a same row in this configuration. The data stored in the complementary test data memory cell is a complement or inverse of the data stored in the corresponding test data memory cell. In order to read a test data memory cell 502, the memory array 500 receives an instruction, from a plurality of column decoders (such as column decoders 300 and 400 of FIGS. 3 and 4).

The instructions initiate the following steps in the memory array for performing the differential read operation. The test data memory cell 502 (D1) is selected and the corresponding complementary test data memory cell 504 (C1) is also selected. A first bitline selection transistor 510 of the first group 219 of the bitline selection transistors is switched on. A second bitline selection transistor 513 of the second group 221 of the bitline selection transistors is switched on. A second group selection transistor 252 from the first group of the group selection transistors 224 is switched on. A second group selection transistor 255 from the second group of the group selection transistors 225 is switched on. The first type of the mode selection transistor 228 is switched on and the second transistor 233 of the second type of the mode selection transistors is switched on. The first transistor 231 of the second type of the mode selection transistors is switched off. This instruction can be repeated for reading any one of the test data memory cells 501.

The steps allow a first bitline 506 of the plurality of the second bitlines 211 to discharge when test memory cell 502 is read. Simultaneously, complementary test memory cell 504 (C1) is read which leads to discharge of current on a second bitline 508 of the plurality of the second bitlines 211. The first bitline 506 is discharged through the transistors 510, 252 and 228. The discharged current is converted into a voltage by the second current to voltage convertor 242. The second bitline 508 is discharged through the transistors 512, 255 and 233. The discharged current is converted into a voltage by the first current to voltage convertor 241.

The outputs of the two current to voltage convertors 241 and 242 are inputs of the comparator or operational amplifier (op-amp) 234. The op-amp 234 compares the two voltage outputs from the current to voltage convertors 241 and 242 and gives a logic high or logic low output. The output of the op-amp 234 is logic high (logic one) if an erased test memory cell 502 is read and the output of the op-amp 234 is logic low (zero) if a programmed test memory cell 502 is read, according to one logic. If a different logic is used, the output of the op-amp 234 can be logic low (logic zero) if an erased test memory cell 502 is read and the output of the op-amp 234 is logic high (one) if a programmed test memory cell 502 is read.

The first type of the mode selection transistor 228 is on because of a high voltage on the gate of the transistor 228. The high voltage on the gate of the transistor 228 also is an input to the inverter 236. The inverter 236 converts the high input voltage to a low output voltage which turns the reference current transistor switch 238 off, isolating the reference current generator with memory cell array 240 from the memory array 500.

FIG. 6 represents the memory array of FIG. 2 in a single ended read operation of a memory array 600. The memory array includes a plurality of user memory sectors 612 and one or more test memory sectors 614.

The test memory sector 614 is configured to perform the differential read operation whereas the user memory sector 612 is configured to perform the single ended read operation. The user memory sectors 612 includes user data memory cells where the user of the memory array 600 stores data for normal data storage operations of the memory array 600. The data stored in the user memory array 612 is used for operations other than memory start-up operation.

The memory array 600 includes the reference current generator with memory cell array 240 to stabilize the bandgap reference current during a read in the single ended read operation. To initiate a single ended read, the memory array 600 receives an instruction to read a user memory cell 602, from the plurality of column decoders, such as those in FIGS. 3 and 4. In response to the instruction, the user memory data cell 602 is selected. A first bitline selection transistor 610 of the first group 219 of the bitline selection transistors is switched on. The first group selection transistor 251 from the first group of the group selection transistors 224 is switched on. The second group selection transistor 252 from the first group of the group selection transistors 224 is switched off. The second group selection transistor 254 and 255 from the second group of the group selection transistors 225 are switched off. The first type of the mode selection transistor 228 is switched off. The second transistor 233 of the second type of the mode selection transistors 230 is switched off and the first transistor 231 of the second type of the mode selection transistors 230 is switched on.

In response, a first bitline 606 of the plurality of the first bitlines 209 is discharged when test memory cell 602 is read. The first bitline 606 is discharged through the transistors 610, 251 and 231. The discharged current is converted into a voltage by the first current to voltage convertor 241. The first type of the mode selection transistor 228 is off because of a low voltage on the gate of the transistor 228. The low voltage on the gate of the transistor 228 is an input to the inverter 236. The inverter 236 converts the low input voltage to a high output voltage which turns the reference current transistor switch 238 on, allowing the reference current generator with memory cell array 240 to provide current to the input of the second current to voltage convertor 242. The second current to voltage convertor 242 converts the input current to voltage.

The outputs of the two current to voltage convertors 241 and 242 are inputs to the operational amplifier (op-amp) 234. The op-amp 234 compares the two voltage outputs from the current to voltage convertors 241 and 242 and gives a logic high (logic one) or logic low (logic zero) output. The output of the op-amp 234 is logic high if the erased test memory cell 602 is read and the output of the op-amp 234 is logic low if the programmed test memory cell 602 is read, according to one logic. If a different logic is used, the output of the op-amp 234 can be logic low if an erased test memory cell 602 is read and the output of the op-amp 234 is logic high if the programmed test memory cell 602 is read.

Figure 10:
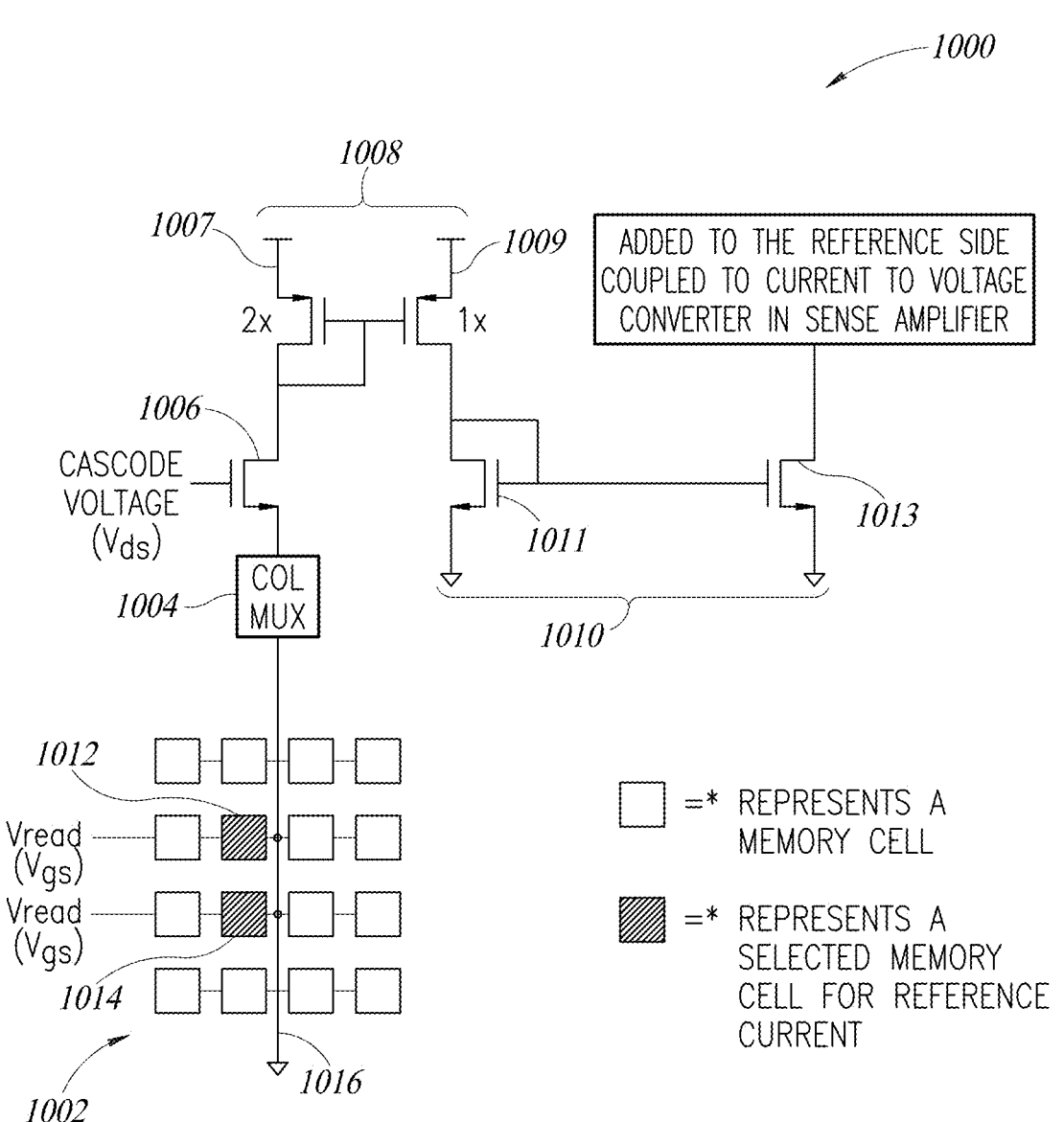
FIG. 10 an enhanced view of a reference current generator of FIG. 2.

FIG. 10 is one of the several possible embodiments of the reference current generator memory 240 of FIGS. 2 and 6. The reference current generator with memory cell array 240 is in the sense amplifier 232 and is configured to provide a more stable reference current during single ended reads of the memory array of FIG. 2. The memory array 240 includes a secondary memory cell array 1002 coupled to a source of a source follower transistor 1006 through a column multiplexor 1004. A drain of the source follower transistor 1006 is coupled to a P-MOS (P-channel metal oxide semiconductor) current mirror 1008, which in-turn is coupled to an N-MOS (N-channel metal oxide semiconductor) current mirror 1010.

The reference current generator with memory cell array 240 can be used in place of the bandgap reference current generation block 104 in conventional memories to provide a more stable reference current. The current generator with memory cell array 240 is constructed such that it can provide a reference current which is more accurate than the bandgap reference current generator block 104, to the memory array 600, for the single ended memory read operation.

To provide more accurate current generation by the reference current generator with memory cell array 240, the secondary memory cell array 1002 is manufactured using the same process as the process used to manufacture the cells of the primary memory cell array 201. This ensures that response of the memory cells of the memory array 1002 to process, temperature, and other operational variations is the same or substantially similar to a response of the memory cells of the primary memory cell array 201. The column multiplexor 1004 of the memory array 240 can have the same architecture as the column multiplexor 220 of the single ended read memory array 600. This minimizes the time variation between the times to read the memory cells of the arrays 201 and 1002.

In order to generate a stable reference current, the memory cells of the secondary memory cells array 1002 are read and averaged together. The secondary memory cells array 1002 includes an even number of memory cells. Half of the memory cells are programmed cells (i.e., a logic one) and half of the memory cells are erased cells (i.e., a logic zero). All or an even subset of the cells of the secondary memory cells array 1002 are selected for reading during a configuration phase. In this example, two cells 1012, 1014 are selected for reading. Alternatively, all of the cells are selected when a more accurate reference current is preferred or an even subset of cells are selected for reading.

The reference current generation memory is configured to average the current produced by the selected cells for reading to output an average current of the array 1002, which is representative of a single memory cell to be compared with the cell being read from the primary memory array. The greater the number of cells selected for reading, the more accurate the reference current from the memory 240 to the memory array 200 will be.

To provide more of the accurate reference current to the memory array 600, the secondary memory cells array 1002 of the memory 240 pre-selects the first memory cell 1012 and the second memory cell 1014, when Vgs or Vread voltage is applied to the gates of the cells 1012 and 1014. Out of the memory cells 1012 and 1014, one cell is an erased memory cell and the other one is a programmed memory cell. On receiving biasing voltage Vds, the source follower transistor 1006 is turned on. This allows a single bit line 1016 to discharge or otherwise settle current through a first P-MOS transistor 1007 of the P-MOS current mirror 1008, and the source follower transistor 1006. The current mirror 1008 allows an average current corresponding to the two memory cells, 1012 and 1014, to flow through a second P-MOS transistor of the P-MOS current mirror 1008. This current then passes through the N-MOS current mirror 1010. The current available on the drain of the N-MOS transistor 1013 of the N-MOS current mirror 1010 is the reference current required for the single-end read operation of the memory array 600.

FIG. 7 includes a configurable row 700 of memory cells 702 such that any memory cell of the row 700 can be configured to operate either in the single ended or the differential read mode. Configurable memory rows 700 can be utilized in the memory array 500 in place of the user memory sector rows 512 or test memory sector rows 514 to provide flexibility to the memory user. With the arrangement of the configurable row 700, the memory user is not compelled to use a memory row only in the differential read mode or only in the single ended read mode. With the rows of the memory array 500, each row is established as a single ended read row or a differential read row and are not adjusted during use. As such, some cells of the memory cells of these rows may not be used by the memory during operation, which may not be the most efficient use of the memory area. In contrast, the configurable rows 700 may be used as a singled ended read row, a differential read row, or a combination of a single ended and differential read row. This provides for flexible use of a memory array formed by a plurality of these configurable rows 700, such that each row can be configured to provide the type of read most beneficial for the overall memory function.

This configurable row 700 arrangement provides area efficiencies and provides access to more memory cells that may not otherwise be accessible in the memory arrays that have dedicated single ended read rows and dedicated differential read rows. With a dedicated differential read row, if some of the cells are not utilized for the start-up or boot operation, those cells remain unused and inaccessible for the life of the memory. In contrast, in the configurable rows 700, any cells not utilized for the start-up or boot operation for the differential read, will remain accessible and usable for user data, read using a single ended read. As such, more of the memory cells in the memory array can be utilized, maximizing the available memory. In one specific embodiment of the configurable memory row 700, there are sixteen memory cells 702. The first four memory cells constitute a first word of the configurable memory row 700 and the last four memory cells constitute a second word of the configurable memory row 700. Eight memory cells are configured as the differential read memory cells and the remaining eight memory cells are configured as the single ended read memory cells. The eight differential read memory cells are equally divided into the test data memory cells D1, D2, D3, D4 and the complementary test data memory cells C1, C2, C3, C4, which are centrally positioned in this embodiment of FIG. 7. In other embodiments, the differential read test data memory cells may be separated from the complementary test data memory cells by singled ended memory cells.

In the embodiment in FIG. 7, there are four singled ended read cells 704 on a first side of the different read cells 706. There are four singled ended read cells 708 on a second side of the different read cells 706. Different configurations of the single ended read cells and the differential read cells are envisioned, such that in a row of configurable memory cells, the row includes a first plurality of single ended read cells separated from a second plurality of single ended read cells by a plurality of differential read cells such that the test data memory cells and the complementary test data memory cells are never placed in the same word out of the first and the second words of the configurable memory row 700. A number of the plurality of differential read cells is equal to a number of the first and second plurality of single ended read cells. For example, in this embodiment there are 8 differential read cells and there are 8 total single ended read cells.

In an alternative embodiment, the configurable row 700 may include ten or twelve cells that are configured for differential read and six or four cells, respectively, that are configured for singled ended read.

The differential read cells may be the first cells of the row and the single ended read cells may be the last cells of the row such that the differential read cells are not between ones of the single ended read cells.

In an example method of use of a memory array that includes a plurality of configurable rows 700, a first row includes a plurality of first memory cells and a second row includes a second plurality of memory cells. The first row is configured to have both single ended and differential read cells in a first arrangement. The second row is configured to have both single ended and differential read cells in a second arrangement that is different from the first arrangement. For example, the first arrangement may be the arrangement in FIG. 7 with single ended read cells on both sides of the differential read cells. The second arrangement may have single ended read cells first, followed by the differential read cells. The number of single ended read cells in the first row may be different than the number of single ended read cells in the second row.

In another configuration the first row is configured to have both single ended and differential read cells in the first arrangement and the second row has only single ended read cells or differential read cells in the second arrangement. In the second arrangement, the differential read cells may be arranged with all of the test data memory cells first, followed by the complementary test data memory cells as long as both the test data memory cells and the complementary test data memory cells are not placed in the same word out of the first and the second word of the configurable memory row 700.

In yet another embodiment, the configurable rows of the memory may each have a first configuration in a first use time period and a second configuration in a second use time period such that the user or manufacturer, such as through an update, can reuse each row as most beneficial to the memory array and current use case of the memory.

FIG. 8 is a portion of a memory array 800, which includes a plurality of configurable memory rows 700. In this embodiment, there are two rows 806, 808 in this portion of the memory array, however, there may be any number of rows selected by the application or the user accessing the memory. The data in each of the rows 806, 808 of the portion is identical. Such identical data in the rows, provides a more accurate read of the memory cells, as the data can be averaged during the differential read or the single ended read. These rows may be integrated with the circuit structures of the Figures of the present disclosure, such as FIGS. 5 and 6. In particular, the column decoders of FIGS. 3 and 4, the sense amplifier, and the reference generator memory 240, among other circuitry will be integrated with these rows to perform the read operations described herein.

In this portion, the two rows 806, 808 have been configured to have a test data cell 802 in a first word of the row and a complementary test data cell 803 in a second word of the row. The other cells may be additional differential read cells or single ended read cells as established by a current use case of the memory.

To read the identical rows, corresponding bitlines of the plurality of bitlines 209 or 211 is discharged through the identical memory cells 802 and 804. These bitlines carry a current that is the average current of the two memory cells 802 and 804. The greater the number of identical memory cells from identical rows of data, the more accurate the read as there will be more cells to average. This averaging minimizes the impact of temperature and process variations, manufacturing differences, and other variations that impact the accuracy of the data in a memory cell. Similarly, in another embodiment, two identical memory cells along the same bitline in the two memory rows 806 and 808 can be read by discharging the corresponding bitline, in case of single ended read.

FIG. 9 is a portion of a memory array 900 which illustrates another embodiment of the memory array of the present disclosure, which can utilize two or more configurable memory rows 700. In this configuration, the test data memory cells are in one row and the corresponding complementary test data memory cells are in another row, based on an encryption logic. Such encryption logic is used in conjunction with the column decoder logic, used to select memory cells for reading. The encryption logic, when used in these memory arrays, produces a memory, which is difficult to hack, hence providing a more secure memory.

This encryption is achieved in the portion of the memory array 900 with a test data memory cell 902 in a first memory row 910 and a corresponding complementary test data memory cell 904 is in a second memory row 912. The test data memory cell 902 is in a second cell of a first word of the first row 910 and the complementary test data memory cell 904 is in a second cell of a second word of the second row 912. For the differential read of the test data memory cell 902, the first and second row are accessed using the encryption logic and the column decoder logic. Likewise a test data memory cell 906 is in a third cell of a second word of the first memory row 910 and a corresponding complementary test data memory cell 908 is in a third cell of a first word of the second memory row 912. Typically, the test data memory cell and the complementary test data memory cell cannot be in the same word.

In this disclosure, read accuracy is achieved by averaging current from multiple memory cells having same data, placed along common bitline, in both single ended and differential read operations. Another technique to improve read accuracy, during normal memory operation is shown where reference current is obtained from a reference memory array of memory cells, made using the same memory cells as primary memory array, referred above as the configurable memory array. Encryption to achieve data security is ensured by placing test data memory cells in one memory row and complementary test data memory cells in another row, in same or staggered word positions.

The present disclosure is directed to a device that includes a configurable memory array that includes a plurality of rows of memory cells, the memory cells of at least one row including a plurality of user data memory cells, a plurality of test data memory cells, and a plurality of complementary test data memory cells. The row includes at least a first word and a second word, the plurality of test data memory cells being in the first word and the plurality complementary test data memory cells being in the second word. A first group of the plurality of user data memory cells is in the first word and a second group of the plurality of user data memory cells is in the second word. The first group of the plurality of user data memory cells is separated from the second group of the plurality of user data memory cells by the plurality of test data memory cells and the plurality of complementary test data memory cells.

The plurality of test data memory cells and the plurality of complementary test data memory cells in the row are separated by the plurality of user data memory cells. The plurality of user data memory cells are configured to be read with a single ended read operation and the plurality of test data memory cells and the plurality complementary test data memory cells are configured to be read with a differential ended read operation. Each row of the plurality of rows includes a first word and a second word, the configurable memory array includes a column multiplexor coupled to the first word and the second word of each row, a sense amplifier coupled to the column multiplexor. The sense amplifier includes a reference current memory cell array. The reference current memory cell array is configured to provide a reference current in the sense amplifier in a single ended read operation.

The present disclosure is directed to a device that includes a configurable memory array having a first row of memory cells including a plurality of test data memory cells and a second row of memory cells including a plurality of complementary test data memory cells that corresponds to the plurality of test data memory cells of the first row. The first row includes a first word and a second word and the second row includes a first word and a second word. A first test data memory cell is in the first word of the first row and a first complementary test data memory cell is in the second word of the second row. A second test data memory cell is in the second word of the first row and a second complementary test data memory cell is in the first word of the second row.

The plurality of test data memory cells in the first word of the first row corresponds the plurality of complementary test data memory cells in the second word of the second row. The plurality of test data memory cells in the second word of the first row corresponds the plurality of complementary test data memory cells in the first word of the second row.

The present disclosure is directed to a method that includes reading a primary memory array by averaging current from two or more memory cells along a first bitline. The reading includes selecting memory rows of the primary memory array, each row storing the same data values in respective memory cells of each row and activating a first plurality of transistors corresponding to the first bitline in a column multiplexor and a sense amplifier according to a column decoder logic. Each of the selected memory rows are adjacent to each other in the primary memory array. The method further includes performing a single ended read operation using the first bitline, wherein the reading includes generating a reference current in a reference current generator memory cell array in the sense amplifier, discharging the first bitline, converting current from the discharged first bitline to a first voltage, converting current from the reference current to a second voltage, and comparing the first voltage to the second voltage.

The generating includes reading a plurality of memory cells from the reference current generator memory cell array, the memory cells of the reference current generator memory cell array having a same temperature and process variation as the primary memory array. The reading of the plurality of memory cells from the reference current generator memory cell array includes transmitting a read signal to a first and second row of reference current generator memory cell array and discharging a bitline of the reference current generator memory cell array with a column multiplexor associated with the memory cells of the first and second rows of the reference current generator memory cell array.

The method further includes performing a differential read operation, the reading includes averaging current from two or more memory cells along a second bitline, the second bitline corresponding to complementary test data memory cells and the first bitline corresponding to test data memory cells. The reading includes activating a second plurality of transistors corresponding to the second bitline in the column multiplexor and the sense amplifier according to the column decoder logic.

The present disclosure is directed to a device that includes a primary memory array having a plurality of bitlines, a plurality of rows of memory cells, a column multiplexor coupled to the plurality of bitlines, and a sense amplifier coupled to the column multiplexor. The sense amplifier includes a reference current generator memory cell array. The reference current generator memory cell array includes a plurality of rows of reference current memory cells, a column multiplexor, and a current mirror. The column multiplexor is coupled between the current mirror and the plurality of rows of the reference current memory cells.

The sense amplifier further includes a first current to voltage convertor, a second current to voltage convertor, the reference current generator memory cell array is coupled to the second current to voltage convertor. The column multiplexor of the primary memory array includes a plurality of bitline selection transistors, a plurality of group selection transistors coupled to the plurality of bitline selection transistors, and a plurality of mode selection transistors coupled to the plurality of group selection transistors and the sense amplifier, a first one of the plurality of mode selection transistors coupled to the reference current generator memory cell array.

The present disclosure is directed to a method that includes forming a primary memory cell array including a plurality of rows of memory cells and a reference current generator memory cell array including a plurality of rows of memory cells in a semiconductor substrate, forming a first column multiplexor and a sense amplifier in the substrate, coupling the first column multiplexor to bitlines of the primary memory cell array, coupling a sense amplifier to the first column multiplexor and to the reference current generator memory cell array. The method further includes forming a first current to voltage convertor and a second current to voltage convertor in the sense amplifier, forming a comparator in the sense amplifier, coupling the first and second current to voltage convertors to the comparator, coupling the reference current generator memory cell array to the second current to voltage convertor.

The method includes coupling first column multiplexor to the first and second current to voltage convertors of the sense amplifier. The method also includes simultaneously forming of the primary memory cell array and forming of the reference current generator memory cell array. The method also includes forming a second column multiplexor, coupling the second column multiplexor to the plurality of rows of the reference current generator memory cell array, forming a current mirror, and coupling the current mirror to the second column multiplexor.

The present disclosure is directed to a device that includes a primary memory array having a first configurable row having a first plurality of memory cells including a first plurality of test data cells and a first plurality of complementary test data cells in a first configuration and having a first data set and a second configurable row having a second plurality of memory cells including a second plurality of test data cells and a second plurality of complementary test data cells in the first configuration and having the first data set. The primary memory array in operation averages corresponding data from the first plurality of test data cells from the first configurable row and the second plurality of test data cells from the second configurable row. The primary memory array includes a third configurable row having a third plurality of memory cells including a third plurality of test data cells and a third plurality of complementary test data cells in the first configuration and having the first data set and in operation, the primary memory array in operation averages corresponding data from the first plurality of test data cells from the first configurable row, the second plurality of test data cells from the second configurable row, and the third plurality of test data cells from the third configurable row.

The first and second configurable rows store the first data set in a first operation time period and in a second operation time period the first configurable row has a second data set in the first plurality of memory cells including in a second configuration and the second configurable row has the second data set in the second plurality of memory cells in the second configuration. The first and second configurable rows store the first data set in a first operation time period and in a second operation time period the first configurable row has a second data set in the first plurality of memory cells and the second configurable row has a third second data set in the second plurality of memory cells, the second and third data set being different.

The present disclosure is directed to a device that includes a substrate, a primary memory array in the substrate, the primary memory array including: a plurality of rows of memory cells, a first column multiplexor coupled to the plurality of rows of memory cells, a sense amplifier coupled to the first column multiplexor, the sense amplifier including: a reference current generator memory array in the substrate. The first column multiplexor includes: a plurality of rows of bitline selection transistors; a plurality of group selection transistors coupled to the plurality of rows of bitline selection transistors; a plurality of mode selection transistors coupled to the plurality of group selection transistors and to the sense amplifier. The first column multiplexor includes a column decoder that includes: a first level shifter coupled between a enable signal and a first one of the plurality of mode selection transistors; a second level shifter coupled between an inverse of the enable signal and coupled to a second one of the plurality of mode selection transistors; and a third level shifter coupled to a third one of the plurality of mode selection transistors.

The first column multiplexor includes a column decoder that includes: a plurality of inverters; a plurality of address bits coupled to the plurality of inverters; a plurality of level shifters coupled to the plurality of address bits and the plurality of inverters. The column decoder includes a plurality of AND gates coupled to the plurality of level shifters and an exclusive OR gate coupled to ones of the plurality of AND gates. The plurality of address bits includes a first address bit coupled to a first one of the plurality of inverters and a second address bit coupled to a second one of the plurality of inverters.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a primary memory array that includes:
   a first configurable row having a first plurality of memory cells including a first plurality of test data cells and a first plurality of complementary test data cells in a first configuration and having a first data set; and
   a second configurable row having a second plurality of memory cells including a second plurality of test data cells and a second plurality of complementary test data cells in the first configuration and having the first data set,
   wherein the first and second configurable rows store the first data set in a first operation time period and, in a second operation time period, the first configurable row has a second data set in the first plurality of memory cells in a second configuration and the second configurable row has the second data set in the second plurality of memory cells in the second configuration.

2. The device of claim 1, wherein the primary memory array in operation averages corresponding data from the first plurality of test data cells from the first configurable row and the second plurality of test data cells from the second configurable row.

3. The device of claim 1, wherein the primary memory array includes a third configurable row having a third plurality of memory cells including a third plurality of test data cells and a third plurality of complementary test data cells in the first configuration and having the first data set and in operation, the primary memory array in operation averages corresponding data from the first plurality of test data cells from the first configurable row, the second plurality of test data cells from the second configurable row, and the third plurality of test data cells from the third configurable row.

4. The device of claim 1, wherein the first and second configurable rows store the first data set in the first operation time period and in the second operation time period the first configurable row has the second data set in the first plurality of memory cells and the second configurable row has a third data set in the second plurality of memory cells, the second and third data sets being different.

5. A device, comprising:
   a memory array, including:
   a first configurable row having a first plurality of memory cells including a first plurality of test data cells and a first plurality of complementary test data cells, the first configurable row having a first data set; and
   a second configurable row having a second plurality of memory cells including a second plurality of test data cells, the second configurable row having the first data set, wherein the memory array averages data from the first plurality of test data cells from the first configurable row and the second plurality of test data cells from the second configurable row, wherein the first and second configurable rows store the first data set in a first operation time period and, in a second operation time period, the first configurable row has a second data set in the first plurality of memory cells in a second configuration and the second configurable row has the second data set in the second plurality of memory cells in the second configuration.

6. The device of claim 5, wherein the memory array includes a third configurable row having a third plurality of memory cells including a third plurality of test data cells, the third configurable row having the first data set, the memory array averaging corresponding data from the first plurality of test data cells from the first configurable row, the second plurality of test data cells from the second configurable row, and the third plurality of test data cells from the third configurable row.

7. The device of claim 5, wherein the first and second configurable rows store the first data set in the first operation time period and in the second operation time period the first configurable row has the second data set in the first plurality of memory cells and the second configurable row has a third data set in the second plurality of memory cells, the second and third data sets being different.

8. The device of claim 6, wherein the second configurable row includes a second plurality of complementary test data cells and the third configurable row includes a third plurality of complementary test data cells.

9. A device, comprising:
   a memory array, including:
   a first configurable memory row including a first test data cell and a first complementary test data cell, the first configurable memory row having a first data set; and
   a second configurable memory row including a second test data cell and a second complementary test data cell, the second configurable memory row having the first data set,
   wherein the first and second configurable memory rows store the first data set in a first operation time period and, in a second operation time period, the first configurable memory row has a second data set and the second configurable memory row has the second data set.

10. The device of claim 9, wherein the first configurable memory row and the second configurable memory row each include a plurality of differential read cells.

11. The device of claim 9, wherein the first configurable memory row and the second configurable memory row each include a plurality of single ended read cells.

12. The device of claim 9, wherein the first test data cell in the first configurable memory row is identical to the second test data cell in the second configurable memory row.

13. The device of claim 12, wherein a first configuration of cells of the first configurable memory row is identical to a second configuration of cells of the second configurable memory row, the first configuration of cells including the first test data cell and the first complementary test data cell and the second configuration of cells including the second test data cell and the second complementary test data cell.

14. The device of claim 12, wherein, to read the first and second configurable memory rows, a bitline coupled between the first and second configurable memory rows is discharged through the first test data cell and the second test data cell.

15. The device of claim 14, wherein the bitline carries a current that is an average of a first current of the first test data cell and a second current of the second test data cell.

16. The device of claim 12, wherein the first complementary test data cell in the first configurable memory row is identical to the second complementary test data cell in the second configurable memory row.

17. The device of claim 16, wherein, to complete a single ended read of the first and second configurable memory rows, a bitline coupled between the first and second configurable memory rows is discharged through the first complementary test data cell and the second complementary test data cell.

18. The device of claim 9, wherein the first configurable memory row is coupled to a first word line driver and the second configurable memory row is coupled to a second word line driver.

* * * * *